(12) United States Patent
Briere et al.

(10) Patent No.: US 8,969,881 B2
(45) Date of Patent: Mar. 3, 2015

(54) POWER TRANSISTOR HAVING SEGMENTED GATE

(71) Applicant: International Rectifier Corporation, El Segundo, CA (US)

(72) Inventors: Michael A. Briere, Scottsdale, AZ (US); Naresh Thapar, San Diego, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/750,986

(22) Filed: Jan. 25, 2013

(65) Prior Publication Data

US 2013/0214283 A1    Aug. 22, 2013

Related U.S. Application Data

(60) Provisional application No. 61/600,407, filed on Feb. 17, 2012.

(51) Int. Cl.
   *H01L 31/0256*    (2006.01)
(52) U.S. Cl.
   USPC ............ 257/76; 257/194; 257/326; 257/368
(58) Field of Classification Search
   USPC ................ 257/76, 192–194, 294, 324–326, 257/368–369; 438/142, 172, 285
   See application file for complete search history.

(56) References Cited

U.S. PATENT DOCUMENTS

| 5,338,954 A * | 8/1994 | Shimoji | 257/326 |
| 6,744,101 B2 * | 6/2004 | Long et al. | 257/368 |
| 2005/0048702 A1 * | 3/2005 | Bae et al. | 438/142 |
| 2007/0132053 A1 * | 6/2007 | King et al. | 257/499 |
| 2010/0314695 A1 | 12/2010 | Bol | |
| 2011/0084284 A1 | 4/2011 | Zhang | |
| 2011/0210397 A1 * | 9/2011 | Hui et al. | 257/368 |

FOREIGN PATENT DOCUMENTS

| EP | 2 202 801 | 6/2010 |
| JP | H 8-181309 | 7/1996 |
| JP | 2012-4573 | 1/2012 |
| WO | WO 2007/081807 | 7/2007 |
| WO | WO 2011/100304 | 8/2011 |

OTHER PUBLICATIONS

Ha et al., "SiO₂ Passivation Effects on the Leakage Current in AlGaN/GaN High-Electron-Mobility Transistors Employing Additional Schottky Gate", Apr. 1, 2007, Japanese Journal of Applied Physics, vol. 46, No. 4B, pp. 2291-2295.
Vetury et al., "Performance and RF Reliability of GaN-on-SiC HEMT's using Dual-Gate Architectures", Jun. 1, 2006, Microwave Symposium Digest, pp. 714-717.

* cited by examiner

*Primary Examiner* — Dung A. Le
(74) *Attorney, Agent, or Firm* — Farjami & Farjami LLP

(57) ABSTRACT

There are disclosed herein various implementations of a transistor having a segmented gate region. Such a transistor may include at least one segmentation dielectric segment and two or more gate dielectric segments. The segmentation dielectric segment or segments are thicker than the gate dielectric segments, and is/are situated between the gate dielectric segments. The segmentation dielectric segment or segments cause an increase in the effective gate length so as to improve resistance to punch-through breakdown between a drain electrode and a source electrode of the transistor when the transistor is off.

19 Claims, 4 Drawing Sheets

POWER TRANSISTOR HAVING SEGMENTED GATE

The present application claims the benefit of and priority to a provisional application entitled "Segmented Transistor with Improved Gate and Channel Regions," Ser. No. 61/600,407 filed on Feb. 17, 2012. The disclosure in this provisional application is hereby incorporated fully by reference into the present application.

STATEMENT OF GOVERNMENT INTEREST

This invention was made with Government support under Contract No. DE-AR0000016 awarded by Advanced Research Projects Agency-Energy (ARPA-E). The Government has certain rights in this invention.

BACKGROUND

I. Definitions

As used herein, the phrase "group III-V" refers to a compound semiconductor that includes a group V element and at least one group III element. Moreover, the phrase "III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{1-x-y}As_aP_bN_{(1-a-b)}$), for example. III-Nitride also refers generally to any polarity including but not limited to Ga-polar, N-polar, semi-polar or non-polar crystal orientations. A III-Nitride material may also include either the Wurtzitic, Zincblende, or mixed polytypes, and may include single-crystal, monocrystalline, polycrystalline, or amorphous structures.

Also as used herein, the phrase "group IV" refers to a semiconductor that includes at least one group IV element, including silicon (Si), germanium (Ge), and carbon (C), and also includes compound semiconductors such as SiGe and SiC, for example. Group IV may also refer to a semiconductor material which consists of layers of group IV elements or doping of group IV elements to produce strained silicon or other strained group IV material. In addition, group IV based composite substrates may include semiconductor on insulator (SOI), separation by implantation of oxygen (SIMOX) process substrates, and silicon on sapphire (SOS), for example.

II. Background Art

Power transistors, such as group III-V field-effect transistors (group III-V FETs) and group III-V high electron mobility transistors (group III-V HEMTs) are often utilized in high power switching applications. For example, III-Nitride HEMTs may be utilized to provide switching and/or amplification functions.

As the voltage requirements for power transistors continue to increase, ever longer gates are required to provide punch-through resistance when the power transistor is in the blocking state, i.e., turned off. However, longer gate lengths may be associated with degradation of the conduction channel underlying the gate due to damage to the power transistor surface during fabrication.

SUMMARY

The present disclosure is directed to a transistor having segmented gate region, substantially as shown in and/or described in connection with at least one of the figures, and as set forth more completely in the claims.

DETAILED DESCRIPTION

Figure 1:
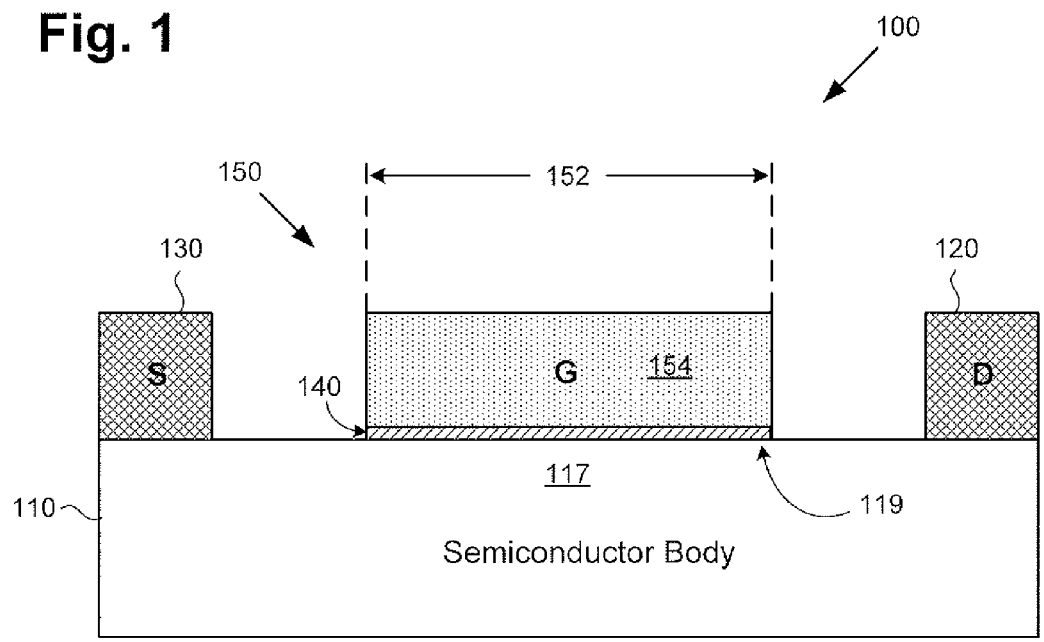
FIG. 1 presents a cross-sectional view of a conventional transistor.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, as the voltage requirements for power transistors continue to increase, ever longer gates are required to provide punch-through resistance when the power transistor is turned off. However, and as further noted above, a longer gate length can result in degradation of the conduction channel underlying the gate due to damage to the power transistor surface during fabrication. For example, damage to a barrier layer implemented as part of a group III-V high electron mobility transistor (group III-V HEMT) can degrade the two-dimensional electron gas (2DEG) providing the conduction channel of the HEMT, thereby compromising performance.

FIG. 1 presents a cross-sectional view of a conventional transistor. As shown in FIG. 1, conventional transistor 100 includes drain electrode 120 and source electrode 130 situated over surface 119 of semiconductor body 110. In addition, conventional transistor 100 has gate 150 including gate electrode 154 and gate dielectric 140 disposed over active gate region or channel region 117. As further shown in FIG. 1, gate 150 has gate length 152. It is noted that in some implementations, gate 150 may include a metal-semiconductor gate electrode as gate electrode 154, or P type gallium nitride (GaN) or P type aluminum gallium nitride (AlGaN) layers between a metal gate electrode and an AlGaN barrier or GaN capping layer of conventional transistor 100.

Semiconductor body 110 may be a group III-V body configured to operate as a power transistor, such as a HEMT. For example, semiconductor body 110 may include a group III-V heterostructure providing surface 119 of semiconductor body 110 (heterostructure not explicitly shown as such in FIG. 1), and configured to generate a 2DEG conductive channel in the active gate region or channel region 117.

However, conventional transistor 100 may suffer degradation of the conductive channel produced in channel region 117 due to damage to surface 119 of semiconductor body 110 during fabrication of conventional transistor 100. In particular, the conductive channel in channel region 117 may be degraded by fabrication of gate 150 over surface 119, due to the relatively larger exposure of surface 119 during formation of the active gate region having gate length 152. For example, fabrication of the active gate region or channel region 117 may include etching away of a field nitride or other protective dielectric layer at surface 119 prior to formation of the active gate region or channel region 117 and fabrication of gate dielectric 140 (field nitride layer not shown in FIG. 1).

Etching away of the field nitride layer at surface 119 of semiconductor body 100 typically results in exposure of surface 119 along substantially the entire extent of gate length 152. Reaction of the exposed surface 119 with the etching agent, which may be a wet or dry etchant, along gate length 152 can degrade the barrier layer of semiconductor body 110 in active gate region or channel region 117, resulting in an increased sheet resistance or otherwise degrading the conduction channel formed therein. For example, etching away of the field nitride layer down to surface 119 may change the surface states of semiconductor body 110 under gate dielectric 140 by embedding or removing charged carriers in the vicinity of channel region 117. Moreover, such processing may lead to thinning of GaN capping or barrier layers, or the formation of undesirable thin film layers above the barrier layer. Consequently, and because the degradation of the conduction channel may correspond to the extent of exposure of surface 119 during fabrication of gate dielectric 140, increases in gate length 152 are associated with greater degradation of the conduction channel.

Thus, the efficiency and thermal stability of conventional transistor 100 may be compromised as a result of implementation of the longer gate lengths required for punch-through resistance at higher voltages. The present application discloses a solution enabling implementation of a transistor, such as a power transistor, having a longer effective gate length sufficient to prevent punch-through breakdown of the device, while substantially reducing or preventing degradation to the transistor conduction channel during fabrication. As shown and described by reference to FIG. 2 through FIG. 5, various implementations of the present inventive concepts accomplish this advantageous result through use of a segmented gate region.

Figure 2:
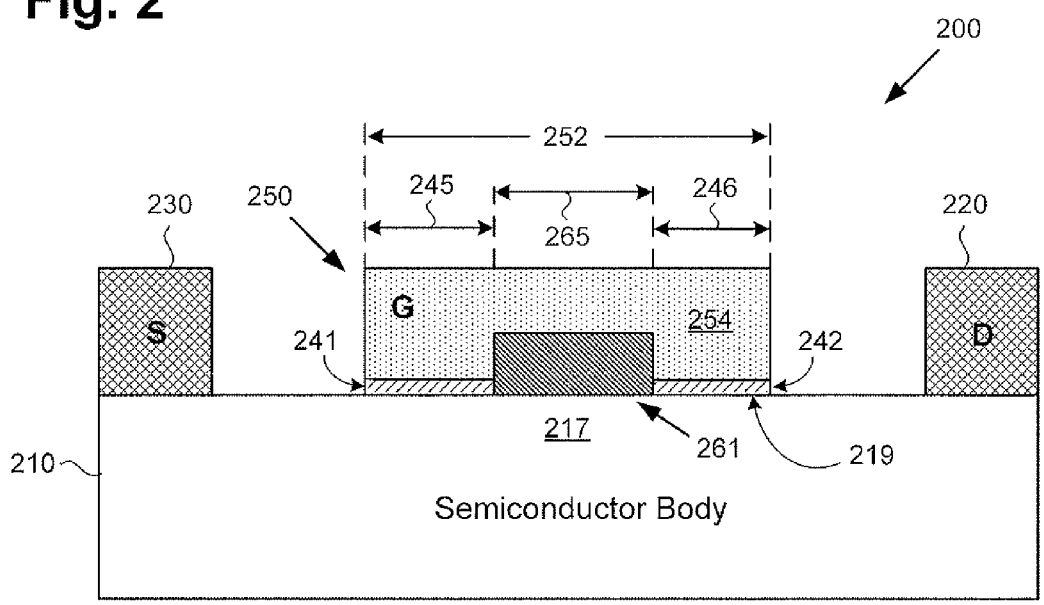
FIG. 2 presents a cross-sectional view of an exemplary transistor having a segmented gate region, according to one implementation.

FIG. 2 presents a cross-sectional view of an transistor having a segmented gate region, according to one implementation. Transistor 200 includes drain electrode 220 and source electrode 230 situated over surface 219 of semiconductor body 210. In addition, transistor 200 includes gate 250 having gate electrode 254 formed over first and second gate dielectric segments 241 and 242 and segmentation dielectric segment 261. Also shown in FIG. 2 are effective gate length 252, segmentation dielectric segment length 265, and respective first and second gate dielectric segment lengths 245 and 246.

Transistor 200 may be a power transistor, for example, implemented as a high voltage transistor, and may take the form of an insulated-gate field-effect transistor (IGFET) or as a heterostructure FET (HFET). In one implementation, transistor 200 may be a metal-insulator-semiconductor FET (MISFET), such as a metal-oxide-semiconductor FET (MOSFET). Alternatively, when implemented as a power HFET, transistor 200 may be a HEMT producing a 2DEG.

For example, semiconductor body may be formed of III-Nitride materials including GaN and/or its alloys, such as AlGaN indium gallium nitride (InGaN), and aluminum indium gallium nitride (AlInGaN). These materials are semiconductor compounds that have a relatively wide, direct bandgap and strong piezoelectric polarizations, and can enable high breakdown fields, and the creation of 2DEGs. As a result, III-Nitride materials such as GaN are used in many microelectronic applications in which high power density and high efficiency switching are required.

Gate electrode 254 may be implemented as a conductive polysilicon electrode, or as a metal electrode, for example. Gate electrode 254 is formed over first and second gate dielectric segments 241 and 242, and segmentation dielectric segment 261. In a depletion mode (normally on) HEMT, first and second gate dielectric segments 241 and 242 permit transistor 200 to be turned off by depleting a conduction channel in channel region 217 between drain electrode 220 and source electrode 230. First and second gate dielectric segments 241 and 242 may be formed of any suitable gate dielectric material, such as silicon oxide ($SiO_2$) or silicon nitride ($Si_3N_4$), for example.

Transistor 200 also includes segmentation dielectric segment 261, formed so as to be situated between first and second gate dielectric segments 241 and 242 and having segmentation dielectric segment length 265. Like first and second gate dielectric segments 241 and 242, segmentation dielectric segment 261 may be formed of silicon oxide or silicon nitride, or any other suitable dielectric material. However, as shown in FIG. 2, segmentation dielectric segment 261 is substantially thicker than first and second gate dielectric segments 241 and 242.

It is noted that although the dielectric material utilized to form first and second gate dielectric segments 241 and 242 is depicted as being different than the dielectric material used to form segmentation dielectric segment 261, in FIG. 2, that representation is merely provided to assist in distinguishing those respective features. In some implementations, it may be advantageous or desirable to utilize the same dielectric material, such as silicon oxide or silicon nitride, to form first and second gate dielectric segments 241 and 242 and segmentation dielectric segment 261. It is further noted, however, that even in implementations in which segmentation dielectric segment 261 and first and second gate dielectric segments 241 and 242 are implemented using the same dielectric material, segmentation dielectric segment 261 is thicker than first and second gate dielectric segments 241 and 242.

Due to its relatively greater thickness, segmentation dielectric segment 261 has a greater pinch-off voltage to deplete the 2DEG under it than do first and second gate dielectric segments 241 and 242. In other words, the absolute value of the pinch-off voltage in the conduction channel of channel region 217 under segmentation dielectric segment 261 ($Vp_{Sep}$) is greater than the absolute value of the pinch-off voltage in the conduction channel of channel region 217 under first and second gate dielectric segments 241 and 242 ($Vp_{Gate}$), i.e., $|Vp_{Sep}|>|Vp_{Gate}|$). In certain implementations, it may be advantageous for the pinch-off voltage under segmentation dielectric segment 261 to be two to three times greater than the pinch-off voltage under first and second gate dielectric segments 241 and 242. That is to say, in some implementations, $[(2*|Vp_{Gate}|) \leq |Vp_{Sep}| \leq (3*|Vp_{Gate}|)]$.

In some implementations, for example, segmentation dielectric segment 261 may have a thickness in a range from approximately fifty nanometers to approximately five hundred nanometers (approximately 50 nm to approximately 500 nm). In some implementations, first and second gate dielectric segments 241 and 242 may have a thickness in a range from approximately 10 nm to approximately 50 nm. In one specific implementation, for example, segmentation dielectric segment 261 may be formed to have a thickness of approximately 100 nm, while first and second gate dielectric segments 241 and 242 are formed to a thickness of approximately 30 nm.

For the purposes of punch-through breakdown prevention, transistor 200 has effective gate length 252 substantially equal to the sum of first and second gate dielectric segments 241 and 242 and segmentation dielectric segment 261. However, according to the implementation of FIG. 2, effective gate length 252 can be achieved without exposing a comparable extent of channel region 217 to damage at surface 219.

For example, in the exemplary implementation shown in FIG. 2, fabrication of gate 250 only requires exposure of surface 219, e.g., through etching away of a field nitride or other protective dielectric layer (not shown in FIG. 2), to accommodate the active gate regions of first and second gate dielectric segment lengths 245 and 246. As a result, transistor 200 can be fabricated to have effective gate length 252 despite exposing a substantially lesser extent of surface 219 to damage (i.e., length 245+length 246). Thus, segmentation dielectric segment 261 causes an increase in the effective gate length of transistor 200 (e.g., enables implementation of effective gate length 252) so as to improve resistance to punch-through breakdown between drain electrode 220 and source electrode 230 when transistor 200 is off, while also reducing damage to surface 219 during fabrication of transistor 200.

Segmentation dielectric segment 261 may provide the additional benefit of improved thermal stability for transistor 200. In conventional power transistors, for example, a semiconductor body corresponding in general to semiconductor body 210 will tend to heat up under gate 250. Under some conditions, this can lead undesirably to thermal runaway or short carrier effects. Implementation of first and second gate dielectric segments 241 and 242 having segmentation dielectric segment 261 situated between them minimizes the area under gate 250 subject to degraded channel conduction, which can exacerbate these effects, and therefore may provide for a more stable device. For example, transistor 200 may have greater thermal stability at saturation than conventional transistor 100, shown in FIG. 1.

In some implementations, it may be advantageous or desirable to form effective gate length 252 to be greater than approximately two micrometers (2.0 µm) to maintain a high resistance to punch-through breakdown between drain electrode 220 and source electrode 230 when transistor 200 is off. In some implementations, it may be advantageous or desirable to limit first and second gate dielectric segment lengths 245 and 246 to approximately 0.75 µm. In some implementations, it may be advantageous or desirable to increase segmentation dielectric segment length 265 in order to minimize the etch induced damage to surface 219 of semiconductor body 210. According to one exemplary implementation, transistor 200 may have an approximately 2.0 µm effective gate length 252, with first and second gate dielectric segments 241 and 242 contributing approximately 0.7 µm each, and segmentation dielectric segment 261 contributing approximately 0.6 µm.

Figure 3:
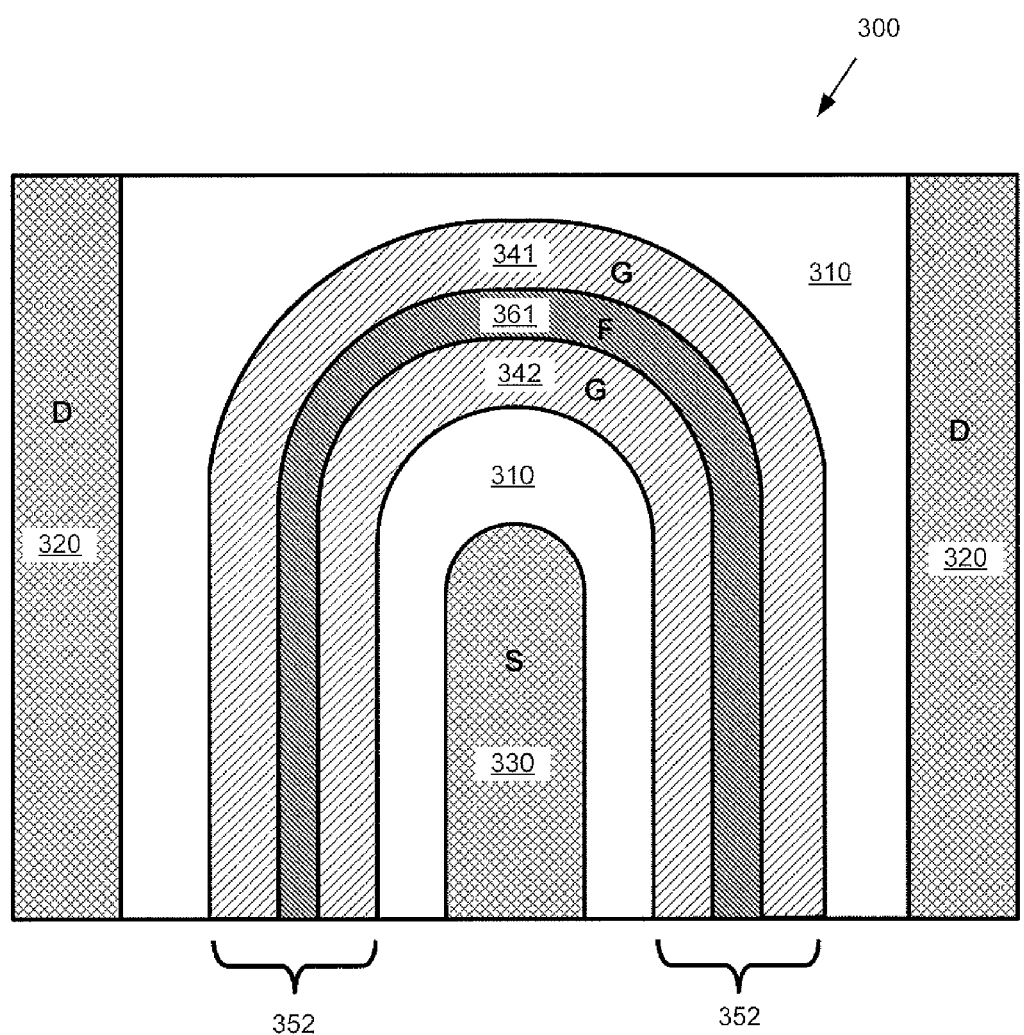
FIG. 3 presents a plan view of an exemplary transistor having a segmented gate region, corresponding in general to the implementation shown in FIG. 2.

FIG. 3 presents a plan view (top view) of an exemplary transistor having a segmented gate dielectric region, corresponding in general to the implementation shown in FIG. 2. FIG. 3 shows a portion of transistor 300 including semiconductor body 310, drain electrodes 320, and source electrode 330. It is noted that the perspective shown by FIG. 3 is as though "seen through" gate electrode 254, in FIG. 2. Thus, FIG. 3 shows first and second gate dielectric segments 341 and 342, and segmentation dielectric segment 361 formed so as to be situated between first and second gate dielectric segments 341 and 342. Also shown in FIG. 3 is effective gate length 352.

Semiconductor body 310, drain electrodes 320, source electrode 330, and effective gate length 352 correspond respectively to semiconductor body 210, drain electrode 220, source electrode 230, and effective gate length 252, in FIG. 2. In addition, first and second gate dielectric segments 341 and 342, and segmentation dielectric segment 361, in FIG. 3, correspond respectively to first and second gate dielectric segments 241 and 242, and segmentation dielectric segment 261, in FIG. 2.

According to the implementation shown in FIG. 3, first and second gate dielectric segments 341 and 342, and segmentation dielectric segment 361 wrap around source electrode 330. Consequently, the gate of transistor 300 having effective gate length 352 wraps around source electrode 330 as well. As a result, as shown by the present exemplary implementation, transistor 300 may be configured to have a "racetrack" topology.

Figure 4:
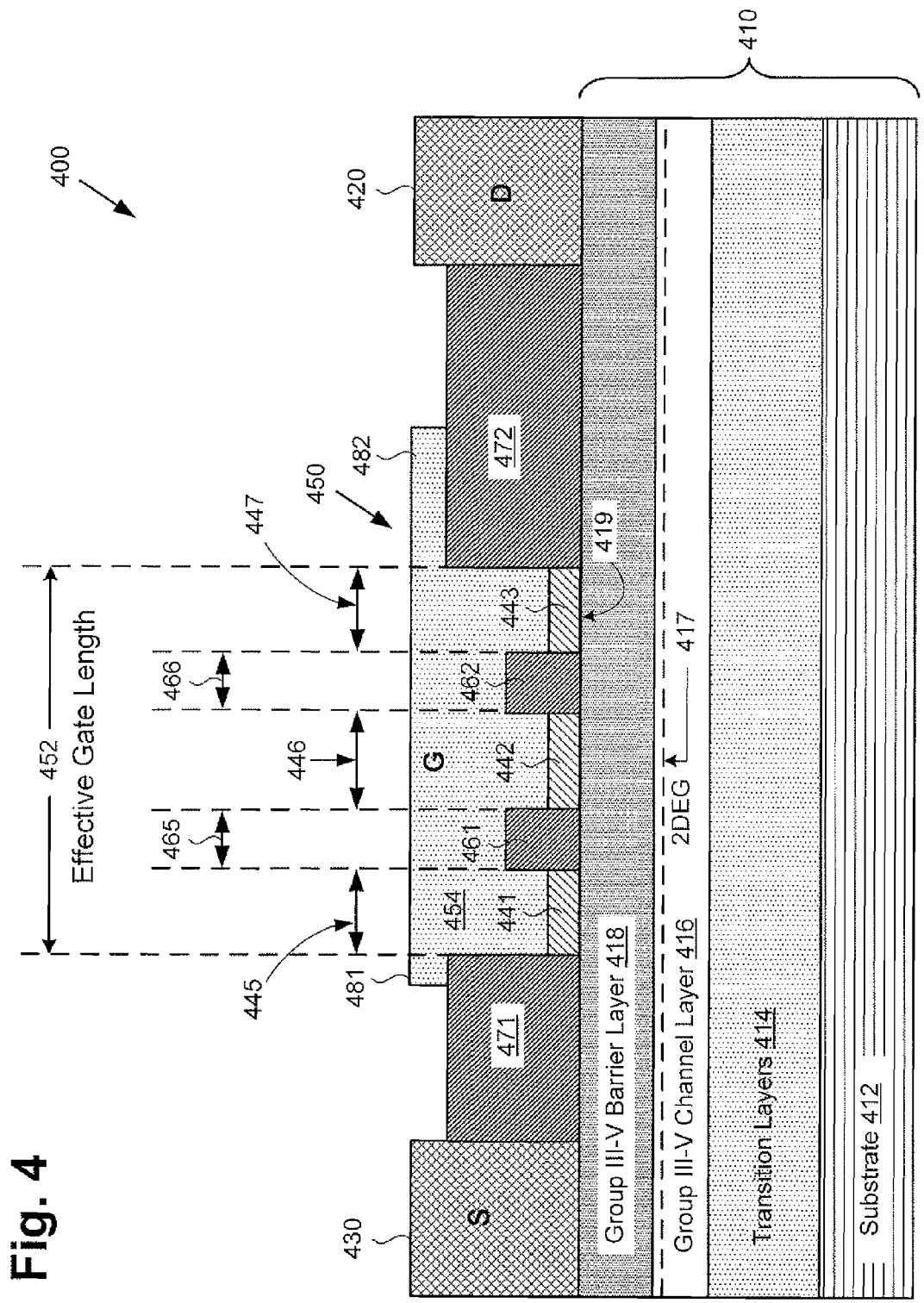
FIG. 4 presents a more detailed cross-sectional view of an exemplary transistor having a segmented gate region, according to another implementation.

FIG. 4 presents a more detailed cross-sectional view of an exemplary transistor having a segmented gate region, according to another implementation. As shown in FIG. 4, transistor 400 includes drain electrode 420 and source electrode 430 situated over surface 419 of semiconductor body 410. In addition, transistor 400 includes gate 450 having gate electrode 454 formed over first, second, and third gate dielectric segments 441, 442 and 443, as well as over first and second segmentation dielectric segments 461 and 462. Also shown in FIG. 4 are effective gate length 452, respective first and second segmentation dielectric segment lengths 465 and 466, respective first, second, and third gate dielectric segment lengths 445, 446, and 447, field dielectric segments 471 and 472, and field plates 481 and 482.

Transistor 400 and gate electrode 454 correspond in general to transistor 200 and gate electrode 254, in FIG. 2, and may share any of the characteristics attributed to those generally corresponding features above. In addition, effective gate length 452 and semiconductor body 410, in FIG. 4, correspond respectively to effective gate length 252 and semiconductor body 210, in FIG. 2. First, second, and third gate dielectric segments 441, 442, and 443, in FIG. 4, correspond to first and second gate dielectric segments 241 and 242, in FIG. 2, while first and second segmentation dielectric segments 461 and 462 correspond to segmentation dielectric segment 261. Moreover, drain electrode 420 and source electrode 430, in FIG. 4, correspond respectively to drain electrode 220 and source electrode 230, in FIG. 2.

It is noted that that transistor 400, in FIG. 4, includes more gate dielectric segments (3) and more segmentation dielectric segments (2) than transistor 200, in FIG. 2, which includes two gate dielectric segments and one segmentation dielectric segment. As a general matter, implementations of the present inventive concepts include a plurality of gate dielectric segments and one or more segmentation dielectric segments formed so as to be situated, respectively, between the gate dielectric segments. It is further noted that, like transistor 200, transistor 400, in FIG. 4, also may also be implemented using the exemplary layout shown in FIG. 3. In other words, gate electrode 454, first, second, and third gate dielectric segments 441, 442, and 443, and first and second segmentation dielectric segments 461 and 462 may wrap around source electrode 430 of transistor 400 in a "racetrack" topology.

As shown in FIG. 4, semiconductor body 410 includes substrate 412, transition layers 414, group III-V channel layer 416, group III-V barrier layer 418, which may also include a capping layer, and 2DEG 417 produced near the heterojunction interface of group III-V channel layer 416 and group III-V barrier layer 418. It is noted that, according to the exemplary implementation of FIG. 4, transistor 400 is depicted as a group III-V HEMT.

Substrate 412 may be formed of any commonly utilized substrate material. For example, substrate 412 may be formed of sapphire, or may be a group IV substrate as described above in the "Definitions" section. Transition layers 414 may include multiple group III-V layers. According to one implementation, transition layers 414 may also include a strain-absorbing layer formed over substrate 412. Such a strain-absorbing layer may be an amorphous strain-absorbing layer, for example, an amorphous silicon nitride layer. It is noted that in implementations in which substrate 412 is a non-native substrate for group III-V channel layer 416 and group III-V harrier layer 418 (i.e., a non group III-V substrate such as a silicon or other group IV substrate), transition layers 414 are provided to mediate the lattice mismatch between substrate 412 and group III-V channel layer 416.

In some implementations, transition layers 414 may be formed of compositionally graded III-Nitride or other group III-V materials. In such implementations, the specific compositions and thicknesses of transition layers 414 may depend on the diameter and thickness of substrate 412, and the desired performance of transistor 400. For example, the desired breakdown voltage of transistor 400, as well as the desired bow and warp of the associated epitaxial wafer supporting fabrication of transistor 400 can influence the compositions and thicknesses of transition layers 414, as known in the art.

As shown in FIG. 4, group III-V channel layer 416 is formed over transition layers 414, and group III-V barrier layer 418 is formed over group III-V channel layer 416. In addition a thin group III-V capping layer may be used over group III-V barrier layer 418 (capping layer not shown). In one implementation, for example, a III-Nitride HEMT may be formed through use of a GaN layer as group III-V channel layer 416 and use of an AlGaN layer as group III-V harrier layer 418. It is noted that the optional capping layer described above may be formed of GaN or AlGaN and may be intentionally doped or may be substantially undoped. As further shown in FIG. 4, 2DEG 417 is produced by the heterojunction forming the interface of group III-V channel layer 416 and group III-V barrier layer 418. Although not shown in FIG. 4, it is noted that in certain applications, it may be desirable to form group III-V barrier layer 418 over a spacer layer (or layers) disposed between group III-V barrier layer 418 and group III-V channel layer 416.

Drain electrode 420 and source electrode 430 are formed over group III-V barrier layer 418. Drain electrode 420 and source electrode 430 are formed such that they make ohmic contact with 2DEG 417. In the implementation shown by FIG. 4, gate electrode 454 is formed over first, second, and third gate dielectric segments 441, 442, and 443, and first and second segmentation dielectric segments 461 and 462, and is thus capacitively coupled to group III-V barrier layer 418.

Transistor 400 has effective gate length 452 substantially equal to the sum of first, second, and third gate dielectric segments 441, 442, and 443, and first and second segmentation dielectric segments 461 and 462. Advantageously, however, according to the implementation of FIG. 4, effective gate length 452 can be achieved without exposing a comparable extent of surface 419 to damage during fabrication of transistor 400.

For example, in the exemplary implementation shown in FIG. 4, fabrication of gate 450 only requires exposure of surface 419, e.g. through etching away of a field dielectric layer not shown in FIG. 4, to accommodate first, second, and third gate dielectric segment lengths 445, 446, and 447. As a result, transistor 400 can be fabricated to have effective gate length 452 despite exposing a substantially lesser extent of surface 419 to damage (i.e., length 445+length 446+length 447). Thus, first and second segmentation dielectric segments 461 and 462 cause an increase in the effective gate length of transistor 400 (e.g., enable implementation of effective gate length 452) so as to improve resistance to punch-through breakdown between drain electrode 420 and source electrode 430 when transistor 400 is off, while also reducing damage to surface 419 during fabrication of transistor 400.

Transistor 400 also includes field dielectric segments 471 and 472 formed, respectively, between gate 450 and source electrode 430, and between gate 450 and drain electrode 420. Field dielectric segments 471 and/or 472 may be formed of the same dielectric material used to form first and second segmentation dielectric segments 461 and 462, such as silicon oxide or silicon nitride, for example. Moreover, in some implementations field dielectric segments 471 and/or 472 can be formed substantially concurrently with formation of first and second segmentation dielectric segments 461 and 462, or may be formed from the same deposited layer(s). However, it is noted that field dielectric segment 472 need not necessarily be formed of the same material as field dielectric segment 471. It is further noted that additional field dielectric segments and/or layers may be formed using a combination of two or more dielectric materials, such as silicon oxide and silicon nitride, for example.

As shown in FIG. 4, gate electrode 454 may be formed to extend over one or both of field dielectric segments 471 and 472 so to have a length greater than effective gate length 452. Terminating gate electrode 454 over field dielectric segments 471 and/or 472 has the added benefit of providing respective field plates 481 and/or 482 for transistor 400.

Figure 5:
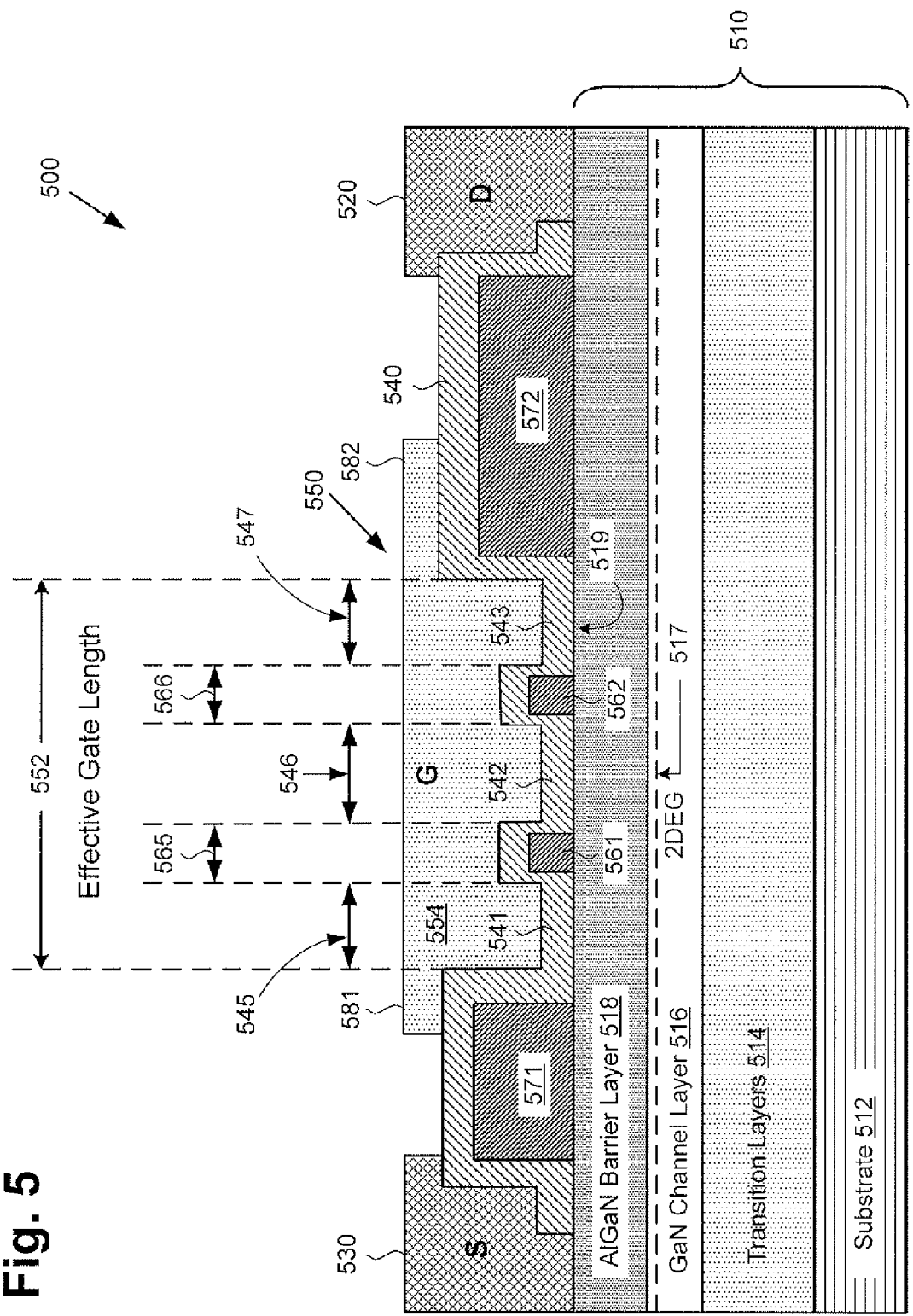
FIG. 5 presents a cross-sectional view of an exemplary transistor having a segmented gate region, according to yet another implementation.

Referring now to FIG. 5, FIG. 5 presents a cross-sectional view of an exemplary transistor having a segmented gate region, according to yet another implementation. As shown in FIG. 5, transistor 500 includes drain electrode 520 and source electrode 530 situated over surface 519 of semiconductor body 510. In addition, transistor 500 includes gate 550 having gate electrode 554 formed over first, second, and third gate dielectric segments 541, 542 and 543, as well as over first and second segmentation dielectric segments 561 and 562. Also shown in FIG. 5 are effective gate length 552, respective first and second segmentation dielectric segment lengths 565 and 566, and respective first, second, and third gate dielectric segment lengths 545, 546, and 547. FIG. 5 further includes field dielectric segments 571 and 572, field plates 581 and 582, and gate dielectric layer 540 including first, second, and third gate dielectric segments 541, 542, and 543.

Transistor 500 corresponds in general to transistor 200/400, in FIG. 2/4, and may share any of the characteristics attributed to that corresponding device above. In addition, gate 550 having effective gate length 552, and semiconductor body 510, in FIG. 5, corresponds to gate 450 having effective gate length 452, and semiconductor body 410, in FIG. 4. First, second, and third gate dielectric segments 541, 542, and 543, in FIG. 5, correspond to first, second, and third gate dielectric segments 441, 442, and 443, in FIG. 4, while first and second segmentation dielectric segments 561 and 562 correspond to first and second segmentation dielectric segments 461 and 462. Moreover, drain electrode 520 and source electrode 530, in FIG. 5, correspond respectively to drain electrode 420 and source electrode 430, in FIG. 4.

As shown in FIG. 5, semiconductor body 510 includes substrate 512, transition layers 514, GaN channel layer 516, AlGaN barrier layer 518, and 2DEG 517 produced near the heterojunction interface of GaN channel layer 516 and AlGaN barrier layer 518. Substrate 512 and transition layers 514 correspond respectively to substrate 412 and transition layers 414, in FIG. 4, and may have any of the characteristics attributed to those corresponding features above. It is noted that, according to the exemplary implementation of FIG. 5, transistor 500 is depicted as a III-Nitride HEW.

Transistor 500 has effective gate length 552 substantially equal to the sum of first, second, and third gate dielectric segments 541, 542, and 543, and first and second segmentation dielectric segments 561 and 562. Advantageously, however, according to the implementation of FIG. 5, effective gate length 552 can be achieved without exposing a comparable extent of surface 519 to damage during fabrication of transistor 500.

For example, in the exemplary implementation shown in FIG. 5, fabrication of gate 550 only requires exposure of surface 519, e.g. through etching away of a barrier dielectric layer not shown in FIG. 5, to accommodate first, second, and third gate dielectric segment lengths 545, 546, and 547. As a result, transistor 500 can be fabricated to have effective gate length 552 despite exposing a substantially lesser extent of surface 519 to damage (i.e., length 545, length 546, length 547). Thus, first and second segmentation dielectric segments 561 and 562 allow for an increase in the effective gate length of transistor 500 (e.g., enable implementation of effective gate length 552) so as to improve resistance to punch-through breakdown between drain electrode 520 and source electrode 530 when transistor 500 is off, while also reducing damage to surface 519 during fabrication of transistor 500.

Like transistor 400, in FIG. 4, transistor 500 includes field dielectric segments 571 and 572 formed, respectively, between gate 550 and source electrode 530, and between gate 550 and drain electrode 520. Field dielectric segments 571 and 572 correspond respectively to field dielectric segments 471 and 472 and thus may be characterized to have any of the features attributed to field dielectric segments 471 and 472 above. In addition, transistor 500, in FIG. 5, is shown to include field plates 581 and 582 corresponding respectively to field plates 481 and 482, in FIG. 4.

In addition, transistor 500 includes gate dielectric layer 540 conformally disposed over surface 519 first and second segmentation dielectric segments 561 and 562, and field dielectric segments 571 and 572. Gate dielectric layer 540 includes first, second, and third gate dielectric segments 541, 542, and 543. Moreover, gate dielectric layer 540 contributes to first and second segmentation dielectric segment lengths 565 and 566, as well as to the effective thickness of first and second segmentation dielectric segments 561 and 562. As shown in FIG. 5, gate electrode 554 may be formed to extend over additional field dielectric 560 and gate dielectric layer 540 so to have a length greater than effective gate length 552. Terminating gate electrode 554 over additional field dielectric 560 and gate dielectric layer 540 has the added benefit of providing field plates 581 and/or 582 for transistor 500.

Thus, by implementing a segmented active gate region having a segmentation dielectric segment situated between each gate dielectric segment, the present application discloses a transistor, such as a power transistor, having an effective gate length substantially equal to the sum of the lengths of the gate dielectric segments and segmentation dielectric segment or segments. Formation of one or more segmentation dielectric segments between gate dielectric segments causes an increase in the effective gate length of a transistor so as to prevent punch-through between the drain and source when the transistor is off, while reducing damage to a surface of the transistor during fabrication of the transistor. Moreover, segmenting the active gate region by situating segmentation dielectric segments between gate dielectric segments can improve thermal stability of the transistor.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A transistor comprising:
a drain electrode and a source electrode situated over a surface of a semiconductor body;
a segmented gate region including at least one segmentation dielectric segment situated on said surface, said segmented gate region controlling conduction between said drain electrode and said source electrode through a conduction channel;
said segmented gate region configured to improve resistance to punch-through breakdown between said drain electrode and said source electrode when said transistor is off.

2. The transistor of claim 1, wherein said segmented gate region includes at least two gate dielectric segments.

3. The transistor of claim 2, wherein said segmented gate region has an effective gate length greater than a sum of respective lengths of said at least two gate dielectric segments.

4. The transistor of claim 1, wherein said segmented gate region has an effective gate length greater than a length of said at least one segmentation dielectric segment.

5. The transistor of claim 1, wherein said segmented gate region includes at least two gate dielectric segments, and wherein said segmented gate region has an effective gate length substantially equal to a sum of respective lengths of said at least one segmentation dielectric segment and said at least two gate dielectric segments.

6. The transistor of claim 1, wherein said segmented gate region includes at least two gate dielectric segments, and wherein a pinch-off voltage of said conduction channel under said at least one segmentation dielectric segment is greater than a pinch-off voltage of said conductor channel under said at least two gate dielectric segments.

7. The transistor of claim 1, wherein said at least one segmentation dielectric segment is formed of one of silicon oxide and silicon nitride.

8. The transistor of claim 1, wherein said segmented gate region includes at least two gate dielectric segments formed from one of silicon oxide and silicon nitride.

9. The transistor of claim 1, wherein said conduction channel includes a 2-dimensional electron gas (2DEG).

10. The transistor of claim 1, wherein said transistor comprises a group III-V heterostructure field-effect transistor (group III-V HFET).

11. The transistor of claim 1, wherein said transistor comprises a III-Nitride high electron mobility transistor (III-Nitride HEMT).

12. The transistor of claim 1, wherein said transistor includes a channel layer formed of gallium nitride (GaN), and a barrier layer formed of aluminum gallium nitride (AlGaN) disposed over said channel layer.

13. The transistor of claim 1, wherein said at least one segmentation dielectric segment wraps around said source electrode.

14. The transistor of claim 1, further comprising a gate electrode disposed over said at least one segmentation dielectric segment, said gate electrode comprising metal.

15. The transistor of claim 1, further comprising at least one field dielectric segment.

16. The transistor of claim 1, further comprising at least two gate dielectric segments and at least one field dielectric segment.

17. The transistor of claim 1, further comprising at least one field dielectric segment, wherein said field dielectric segment and said at least one segmentation dielectric segment are formed of the same dielectric material.

18. The transistor of claim 1, further comprising at least two gate dielectric segments, wherein a thickness of said at least one segmentation dielectric segment is greater than a thickness of said at least two gate dielectric segments.

19. The transistor of claim 1, further comprising a field plate.

* * * * *